(12) United States Patent
Maruyama et al.

(10) Patent No.: US 8,981,761 B2
(45) Date of Patent: Mar. 17, 2015

(54) PARTIAL DISCHARGE DETECTOR FOR GAS-INSULATED ELECTRIC APPARATUS

(75) Inventors: Shiro Maruyama, Yokohama (JP);
Toshihiro Hoshino, Yokohama (JP);
Takaaki Sakakibara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 12/896,020

(22) Filed: Oct. 1, 2010

(65) Prior Publication Data

US 2011/0080161 A1    Apr. 7, 2011

(30) Foreign Application Priority Data

Oct. 2, 2009   (JP) ................ P2009-230823

(51) Int. Cl.
*G01R 31/00* (2006.01)
*G01R 31/02* (2006.01)
*H01H 9/50* (2006.01)
*G01R 31/12* (2006.01)

(52) U.S. Cl.
CPC .................. *G01R 31/1254* (2013.01)
USPC ............ 324/122; 324/536; 324/544

(58) Field of Classification Search
CPC ........... G01R 31/1254; G01R 31/1281; G01R 31/085; H02B 13/065
USPC ................................ 324/122, 126
See application file for complete search history.

(56) References Cited

U.S. PATENT DOCUMENTS

| | | | | |
|---|---|---|---|---|
| 5,804,972 | A * | 9/1998 | de Kock et al. | 324/536 |
| 6,255,808 | B1 * | 7/2001 | Hucker | 324/122 |
| 6,300,768 | B1 * | 10/2001 | Kato et al. | 324/536 |
| 7,746,082 | B2 * | 6/2010 | Maruyama et al. | 324/544 |
| 2002/0024341 | A1 | 2/2002 | Rokunohe et al. | |
| 2006/0132144 | A1 * | 6/2006 | Kato et al. | 324/536 |

(Continued)

FOREIGN PATENT DOCUMENTS

| | | |
|---|---|---|
| CN | 1254416 | 5/2000 |
| CN | 101202425 | 6/2008 |

(Continued)

OTHER PUBLICATIONS

Machine translation of JP 2001141773 A.*

(Continued)

*Primary Examiner* — Jermele M Hollington
(74) *Attorney, Agent, or Firm* — Finnegan, Henderson, Farabow, Garrett & Dunner, L.L.P.

(57) ABSTRACT

A partial discharge detector for gas-insulated electric apparatus of an embodiment detects an electromagnetic wave ascribable to partial discharge in a gas-insulated electric apparatus which is filled with insulating gas, and in which a conductor to which high voltage is applied is supported in conductor supporting holes provided at centers of a plurality of disk-shaped insulating plates, and a plurality of flanged-conductive pipes form a hermetically sealed container, with flange portions thereof pressingly sandwiching and holding peripheral edge portions of the insulating plates from both surface sides. The partial discharge detector for gas-insulated electric apparatus of this embodiment is characterized in that an antenna detecting the electromagnetic wave is disposed in close contact on a portion, of each of the insulating plates, exposed from the flange portions of the flanged conductive pipes, via an elastic member capable of transmitting the electromagnetic wave.

13 Claims, 5 Drawing Sheets

(56) References Cited

U.S. PATENT DOCUMENTS

| | | | |
|---|---|---|---|
| 2007/0139056 A1* | 6/2007 | Kaneiwa et al. | 324/536 |
| 2009/0027062 A1* | 1/2009 | Maruyama et al. | 324/544 |
| 2011/0090134 A1* | 4/2011 | Shinohara et al. | 343/892 |

FOREIGN PATENT DOCUMENTS

| | | | |
|---|---|---|---|
| CN | 101221841 | 7/2008 | |
| JP | 3-78429 | 4/1991 | |
| JP | 10-051917 | 2/1998 | |
| JP | 10-51917 | 2/1998 | |
| JP | 10341520 | 12/1998 | |
| JP | 2000-162263 | 6/2000 | |
| JP | 2001-141773 | 5/2001 | |
| JP | 2001141773 A * | 5/2001 | G01R 31/12 |
| JP | 2002-116235 | 4/2002 | |
| JP | 2002-340969 | 11/2002 | |
| JP | 2004-53364 | 2/2004 | |
| JP | 2006-208017 | 8/2006 | |
| JP | 2007-263640 | 10/2007 | |
| JP | 2009288035 A * | 12/2009 | |
| WO | WO 2009/145025 A1 | 3/2009 | |

OTHER PUBLICATIONS

Machine translation of JP 2009288035 A.*
Machine translation of JP 2001141773A filed on May 2001.*
Machine translation of JP 2009288035A filed on Dec. 2009.*
Combined Search and Examination Report issued by the British Patent Office on Jan. 31, 2011, for British Patent Application No. GB1016389.7.
Notification of First Office Action mailed by the State Intellectual Property Office of The People's Republic of China on Dec. 19, 2012, in Chinese patent application No. 201010535392.3.
Notice of Reasons for Refusal mailed by the Japanese Patent Office on Aug. 6, 2013, in Japanese patent application No. 2009-230823.
Notification of the Second Office Action mated by the State Intellectual Property Office of the People's Republic of China on Aug. 30, 2013, in Chinese patent application No. 201010535392.3.

* cited by examiner

PARTIAL DISCHARGE DETECTOR FOR GAS-INSULATED ELECTRIC APPARATUS

CROSS-REFERENCE TO RELATED APPLICATIONS

This application is based upon and claims the benefit of priority from the prior Japanese Patent Application No. 2009-230823, filed on Oct. 2, 2009; the entire contents of which are incorporated herein by reference.

FIELD

Embodiments described herein relate generally to a device detecting partial discharge occurring near a conductor to which high voltage is applied, and particularly to a partial discharge detector detecting partial discharge occurring inside a gas-insulated apparatus in which the conductor is insulated.

BACKGROUND

In facilities such as power substations handling high voltage, there are generally used gas-insulated apparatuses such as, for example, gas-insulated switchgears, gas-insulated buses, and gas-insulated transformers, in which a conductor to which high voltage is applied is insulated by gas. In the gas-insulated apparatus, a high-voltage conductor to which high voltage is applied is housed in a hermetically sealed metal container filled with insulating gas, and the high-voltage conductor is supported by an insulator.

In such a gas-insulated apparatus, it has been known that, if the metal container has a defective portion with a contact failure or with an intruded metal foreign particle, partial discharge occurs from this defective portion. Leaving the partial discharge in the gas-insulated apparatus as it is would lead to dielectric breakdown before long, which is likely to develop into a serious accident. Therefore, it is important to detect the partial discharge at an early stage and prevent the occurrence of the serious accident by taking measures such as the repair of the defective portion. As a preventive maintenance technique in insulation diagnosis of the gas-insulated apparatus, there has been proposed a detector detecting the partial discharge inside the gas-insulated apparatus.

As discharge detectors detecting the partial discharge inside the gas-insulated apparatus, there have been known those detecting the partial discharge by sensing electric current, electromagnetic waves, sound, vibration, light, and the like. Among them, a device sensing electromagnetic waves generated due to the partial discharge to determine the presence/absence of the partial discharge has been drawing attention because of its high detection sensitivity, high S/N ratio, wide detection range, and so on. Since the electromagnetic waves accompanying the partial discharge include frequency components with frequencies in a wide range from several tens MHz to several GHz, a method of detecting electromagnetic wave signals in UHF band (300 MHz to 3 GHz) that are relatively easily detected has come into the mainstream.

DETAILED DESCRIPTION

Figure 1:
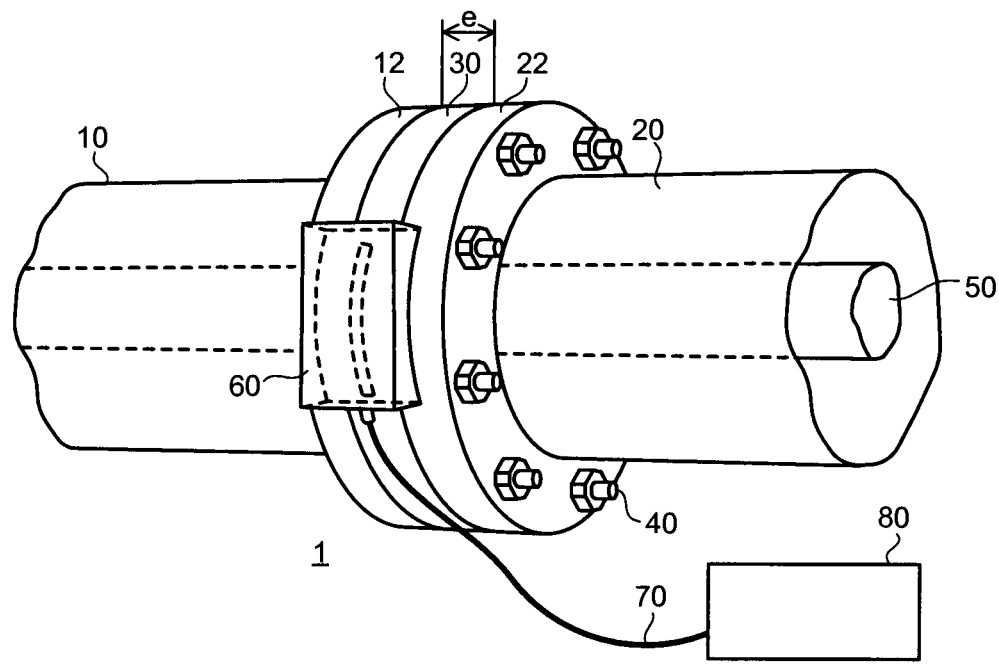
FIG. 1 is a view showing an external appearance of a discharge detector of a first embodiment.

A partial discharge detector for gas-insulated electric apparatus of an embodiment detects an electromagnetic wave ascribable to partial discharge in a gas-insulated electric apparatus which is filled with insulating gas, and in which a conductor to which high voltage is applied is supported in conductor supporting holes provided at centers of a plurality of disk-shaped insulating plates, and a plurality of flanged-conductive pipes form a hermetically sealed container, with flange portions thereof pressingly sandwiching and holding peripheral edge portions of the insulating plates from both surface sides. The partial discharge detector for gas-insulated electric apparatus of this embodiment is characterized in that an antenna detecting the electromagnetic wave is disposed in close contact on a portion, of each of the insulating plates, exposed from the flange portions of the flanged conductive pipes, via an elastic member capable of transmitting the electromagnetic wave.

First Embodiment

Hereinafter, an embodiment of the present invention will be described in detail with reference to the drawings. As shown in FIG. 1 to FIG. 4, a detector 60 (partial discharge detector) of a first embodiment is disposed on an outer side of a gas-insulated apparatus 1.

The gas-insulated apparatus 1 (gas-insulated electric apparatus) on which the detector 60 of this embodiment is disposed forms a cylindrical conductive container covering a high-voltage conductor 50 to which high voltage is applied. Specifically, the gas-insulated apparatus 1 includes: conductive pipes 10 and 20 having flange portions 12 and 22 respectively and housing the high-voltage conductor 50; and insulating spacers 30 each inserted between end surfaces of the flange portions 12 and 22 to support the high-voltage conductor 50.

The conductive pipes 10 and 20 are metal pipes made of a metal material such as aluminum or iron, for instance, and cover the high-voltage conductor 50 while spacing the high-voltage conductor 50 therefrom by a predetermined gap. As shown in FIG. 1, the flange portions 12 and 22 face each other via the insulating spacer 30 and are integrally fixed by assembling bolts 40. That is, the conductive pipes 10 and 20 form conductive pipes coupled to each other.

Figure 3:
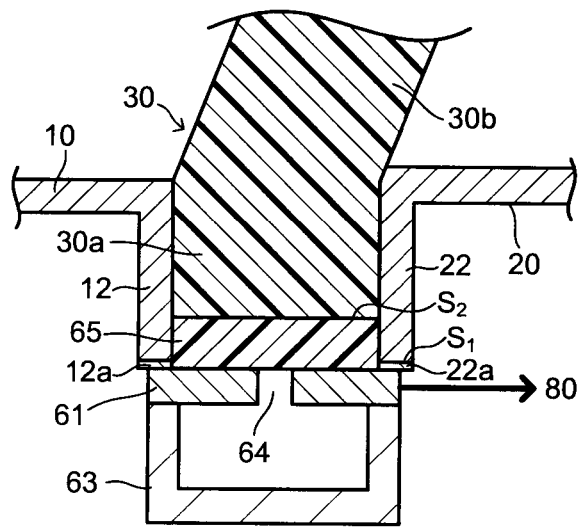
FIG. 3 is a view showing the structure of the discharge detector of the first embodiment.
Figure 4:
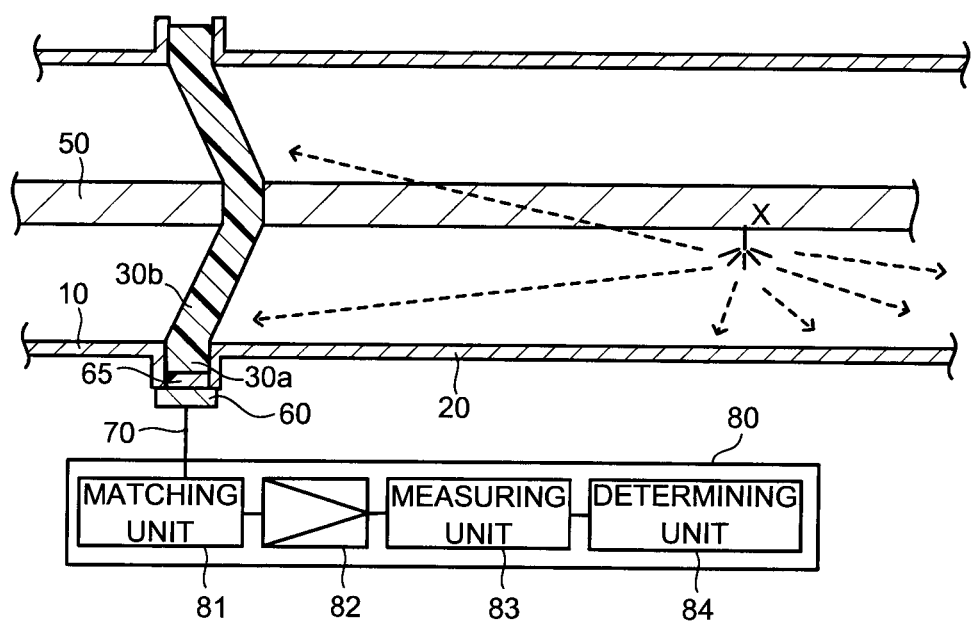
FIG. 4 is a view showing the principle and structure of the discharge detector of the first embodiment.

As shown in FIG. 3 and FIG. 4, the insulating spacer 30 has: an annular portion 30a facing end surfaces of the flange portions 12 and 22 and having a predetermined thickness; and a support portion 30b supporting the high-voltage conductor 50 while keeping the high-voltage conductor 50 in non-contact with and a predetermined distance apart from the conductive pipes 10 and 20, and the insulating spacer 30 is substantially equal in diameter to the flange portions 10, 22. For example, the insulating spacer 30 is a disk-shaped insulating plate having a conductor supporting hole supporting the high-voltage conductor 50 and is provided in plurality for every predetermined length of the coupled conductive pipes. That is, the insulating spacers 30 each not only function as a spacer member coupling the conductive pipes 10 and 20 but also function as a support member supporting the high-voltage conductor 50 inside the conductive pipes 10 and 20. The insulating spacers 30 are made of a material having an insulating property high enough to endure the high voltage applied to the high-voltage conductor 50. The insulating spacers 30 can be made of, for example, alumina-filled epoxy or the like. On an outer peripheral surface of the annular portion 30a of each of the insulating spacers 30 sandwiched by the flange portions 12 and 22, the detector 60 of this embodiment is disposed while being electrically insulated from the coupled conductors 10 and 20. This detector 60 detects partial discharge occurring inside the conductive pipes 10 and 20.

The coupled conductive pipes 10 and 20 form a tubular conductive container that is hermetically sealed and houses the high-voltage conductor 50. Inside the coupled conductive pipes 10 and 20, insulating gas such as $SF_6$, for instance, is filled, so that the high-voltage conductor 50 to which the high voltage is applied is insulated from the conductive pipes 10 and 20. The coupled conductive pipes 10 and 20 are electrically grounded.

Next, the structure of the detector 60 of this embodiment and a positional relation between the coupled conductive pipes 10 and 20 and the detector 60 will be described in detail with reference to FIG. 2 and FIG. 3.

Figure 2:
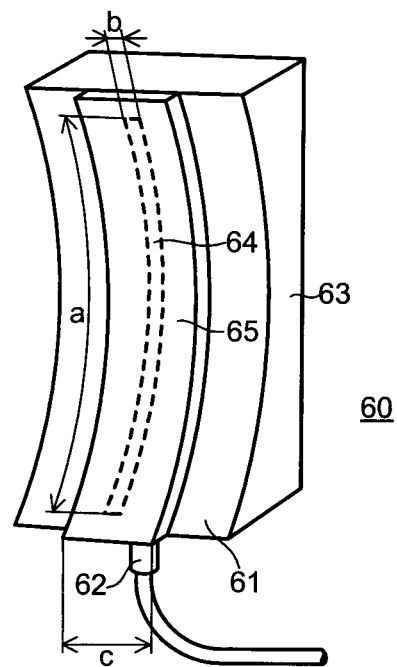
FIG. 2 is a view showing an external appearance of the discharge detector of the first embodiment.

As shown in FIG. 2, the detector 60 of this embodiment includes: a planar slot antenna 61 in which a slot 64 is formed; a connector 62 outputting an electromagnetic wave detected by the slot antenna 61; a casing 63 formed to surround a rear surface of the slot antenna 61; and an elastic member 65 formed on a front surface of the slot antenna 61 so as to cover the slot 64.

The slot antenna 61 detects the electromagnetic wave leaking from the insulating spacer 30. The slot antenna 61 is made of, for example, a rectangular plate-shaped conductor, for example, copper, and is formed in a curved shape so as to match the outer peripheral surface (exposed portion) of the annular portion 30a of the insulating spacer 30, and the slot 64 having a long side a and a short side b is formed at a substantially center portion of the slot antenna 61. The slot 64 has a shape and a size that are determined according to a frequency of the electromagnetic wave that is to be mainly detected. Here, assuming that the insulating spacer 30 is in direct contact with the front surface of the slot antenna 61, a length a of the long side of the slot 64 can be found by the following expression, where $\epsilon_{33}$ is a relative dielectric constant of the insulating spacer 30 and $\lambda c$ is a detection center wavelength.

$$a = \frac{\lambda_C}{2\sqrt{\varepsilon_{33}}} \quad (1)$$

For example, if the relative dielectric constant of the insulating spacer 30 is 3.3 and the length a of the long side of the slot 64 is 150 [mm], the detection center frequency is about 0.55 [GHz]. The slot antenna 61 is disposed near the flange portions 12 and 22 so that the long side of the slot 64 is parallel to the end surfaces of the flange portions 12 and 22 of the conductive pipes 10 and 20. Since the flange portions 12 and 22 are electrically grounded, the slot antenna 61 is disposed while being electrically insulated from the flange portions 12 and 22. Concretely, as shown in FIG. 3, insulating layers 12a and 22a are formed on peripheral edges of the flange portions 12 and 22 so as to prevent the slot antenna 61 itself from being grounded. Incidentally, an antenna of any other type having a planar structure may be used as the slot antenna 61.

The connector 62 is connected to an output end of the slot 64 (part of a pair of the long sides or part of a pair of the short sides) via a coaxial cable or the like to output the electromagnetic wave detected by the slot antenna 61. One end of a coaxial cable 70 transmitting a high-frequency signal of the detected electromagnetic wave is connected to the connector 62, and a signal processing unit 80 is connected to the other end of the coaxial cable 70.

The casing 63 is made of a conductive material and forms a resonant cavity on the rear surface of the slot antenna 61. The casing 63 serves not only to reduce noise received from an external part of the detector 60 but also to improve directivity of the slot antenna 61 to enhance sensitivity in detecting the electromagnetic wave leaking from the insulating spacer 30. The shape and size of the casing 63 are designed according to the main frequency of the electromagnetic waves that are to be detected, and the casing 63 is made of a conductive material such as copper. For example, the casing 63 has such a width that a short-side-direction width t of the slot 64 is expressed as $\lambda/2$, where $\lambda$ is the detection center wavelength of the electromagnetic waves. The casing 63 may be made of a conductive plate to form a perfect sealed space or may be made of a netlike conductor to form an electromagnetically sealed space.

The elastic member 65 is made of a dielectric material having elasticity and is inserted between the insulating spacer 30 and the slot antenna 61. The elastic member 65 works to fill a gap between the insulating spacer 30 and the slot antenna 61, thereby preventing the attenuation of the electromagnetic wave passing therethrough. The elastic member 65 has, for example, a rectangular shape having a size large enough to cover the slot 64, and has a width c smaller than a width e of the outer peripheral surface of the insulating spacer 30 (smaller than a thickness of the annular portion 30a of the insulating spacer 30).

Here, the structure of a coupling portion between the flange portions 12 and 22 and a positional relation of the detector 60 will be described with reference to FIG. 3.

As shown in FIG. 3, the flange portions 12 and 22 sandwich the annular portion 30a of the insulating spacer 30 to fix the insulating spacer 30, but the peripheral edges of the flange portions 12 and 22 ($S_1$ surfaces in FIG. 3) and a peripheral edge surface of the insulating spacer 30 ($S_2$ surface in FIG. 3) are not necessarily flush with each other. In the example shown in FIG. 3, the diameter of the flange portions 12 and 22 are larger than that of the insulating spacer 30, namely the distance between the peripheral edges $S_1$ and the conductor 50 is longer than that between the peripheral edge surface $S_2$ and the conductor 50. Therefore, if the slot antenna 61 of the detector 60 is disposed on the peripheral edges $S_1$ of the flange portions 12 and 22, a gap (space) is made between the end surfaces of the flange portions 12 and 22 and between the peripheral edge surface $S_2$ of the insulating spacer 30 and the front surface of the slot antenna 61. This weakens the electromagnetic wave leaking from the insulating spacer 30.

Therefore, in the detector 60 of this embodiment, the elastic member 65 is inserted between the insulating spacer 30 and the slot antenna 61, whereby the gap is filled with the elastic member 65. Therefore, the elastic member 65 desirably has a thickness equal to or more than a distance between the peripheral edges $S_1$ of the flange portions 12 and 22 and the peripheral edge surface $S_2$ of the insulating spacer 30. Further, a width of the elastic member 65 is desirably equal to or less than a distance between the end surfaces of the flange portions 12 and 22, with a fastening margin being reserved. Further, the elastic member 65 is desirably made of a dielectric material having a relative dielectric constant whose value is substantially equal to a relative dielectric constant of the insulating spacer 30 or as close to the relative dielectric constant of the insulating spacer 30 as possible. This is to prevent the electromagnetic wave leaking from the insulating spacer 30 from attenuating on an interface between the insulating spacer 30 and the elastic member 65. As the elastic member 65, usable is a material, such as Sorbo [Sorbothane: Trademark] (polyurethane) or synthetic rubber (chloroprene rubber), having high elasticity and having a relative dielectric constant whose value is equal to or close to the relative dielectric constant of the insulating spacer 30. Here, the length a of the long side of the slot 64 when the elastic member 65 is inserted between the insulating spacer 30 and the slot antenna 61 can be found by the following expression, where $\epsilon_{65}$ is the relative dielectric constant of the elastic member 65 and $\lambda c$ is the detection center wavelength.

$$a = \frac{\lambda_C}{2\sqrt{\epsilon_{65}}} \quad (2)$$

Next, the structure of the signal processing unit 80 in the detector 60 will be described with reference to FIG. 4.

As shown in FIG. 4, the signal processing unit 80 has a matching unit 81, an amplifying unit 82, a measuring unit 83, and a determining unit 84. The matching unit 81 includes a matching circuit matching the slot antenna 61 with the signal processing unit 80. The matching unit 81 may include a filter circuit such as a band-pass filter, for instance. The amplifying unit 82 amplifies the high-frequency signal received from the slot antenna 61 via the matching unit 81. The measuring unit 83 demodulates the high-frequency signal amplified by the amplifying unit 82 to measure signal level (signal intensity), a signal pattern (frequency characteristic), and so on of the received electromagnetic wave. The determining unit 84 determines, based on the measurement result of the measuring unit 83, whether or not the electromagnetic wave received by the slot antenna 61 is ascribable to partial discharge, that is, whether or not the partial discharge is occurring, by comparing the measurement result with, for example, data accumulated based on past partial discharges or data found by experiments or the like in advance.

(Operation)

As shown in FIG. 4, when partial discharge occurs in a defective portion X inside the gas-insulated apparatus 1, electromagnetic waves of several tens MHz to several ten GHz are generated inside the conductive pipes 10 and 20 (broken lines in FIG. 4). At this time, since the conductive pipes 10 and 20 are coupled to each other in a hermetically sealed manner, the generated electromagnetic waves propagate inside the conductive pipes 10 and 20 in the same manner as when they pass in a waveguide.

Part of the electromagnetic waves generated due to the partial discharge enters the insulating spacer 30 to pass through the peripheral edge surface $S_2$ of the insulating spacer 30 and reaches the slot 64 of the slot antenna 61 through the elastic member 65. When the electromagnetic wave reaches the slot 64, the slot antenna 61 outputs the high-frequency signal from the connector 62. The high-frequency signal output from the connector 62 is sent to the measuring unit 83 via the matching unit 81 and the amplifying unit 82. The measuring unit 83 measures the level and frequency characteristic of the received high-frequency signal to send the measurement result to the determining unit 84. The determining unit 84 determines the presence/absence of the partial discharge based on the measurement result and gives a warning to a user according to the determination result.

According to the detector 60 of this embodiment, since the elastic member 65 having a predetermined dielectric constant is disposed between the insulating spacer 30 guiding the electromagnetic wave ascribable to the partial discharge and the slot antenna 61 detecting the electromagnetic wave, it is possible to reduce a propagation loss of the electromagnetic wave. That is, detection sensitivity of the detector 60 can be improved. Further, in the detector 60 of this embodiment, since the casing 63 forming the cavity on the rear surface of the slot antenna 61 is disposed, it is possible to enhance sensitivity in detecting the electromagnetic wave received via the insulating spacer 30 and to improve S/N by reducing external noise. This achieves enhanced accuracy in determining the presence/absence of the partial discharge.

EXAMPLES

Figure 5A:
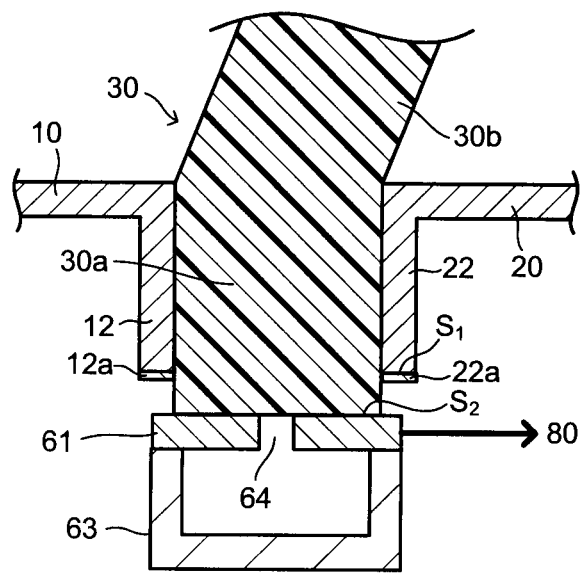
FIG. 5A is a view showing an example where an insulating spacer 30 is larger in diameter than peripheral edges of flange portions.
Figure 5B:
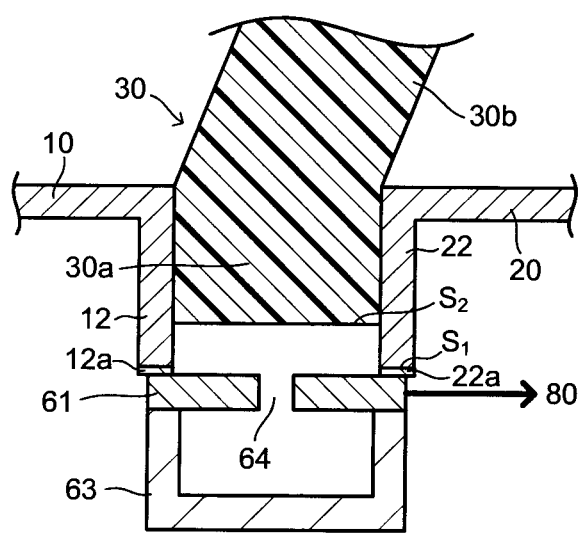
FIG. 5B is a view showing an example where the flange portions are larger in diameter than a peripheral surface of the insulating spacer 30.

Hereinafter, examples of the detector 60 shown in FIG. 1 to FIG. 4 will be described. The long side a of the slot 64 of the slot antenna 61 was set to 150 [mm], and sensitivity characteristics in detecting partial discharge were examined regarding the examples using, as the elastic member 65, a silicon rubber sheet, a synthetic rubber sheet, and a Sorbothane sheet respectively. As comparative examples, the characteristics were examined also when the insulating spacer 30 protruded from the peripheral edges of the flange portions 12 and 22 and the front surface of the slot antenna 61 was in direct contact with the insulating spacer 30 without the elastic member 65 being interposed therebetween as shown in FIG. 5A and when the insulating spacer 30 was located on a deeper side of the peripheral edges of the flange portions 12 and 22 and thus there was a gap between the insulating spacer 30 and the slot antenna 61 (when the elastic member 65 was not provided) as shown in FIG. 5B. The obtained measurement results are shown in FIG. 6.

Figure 6:
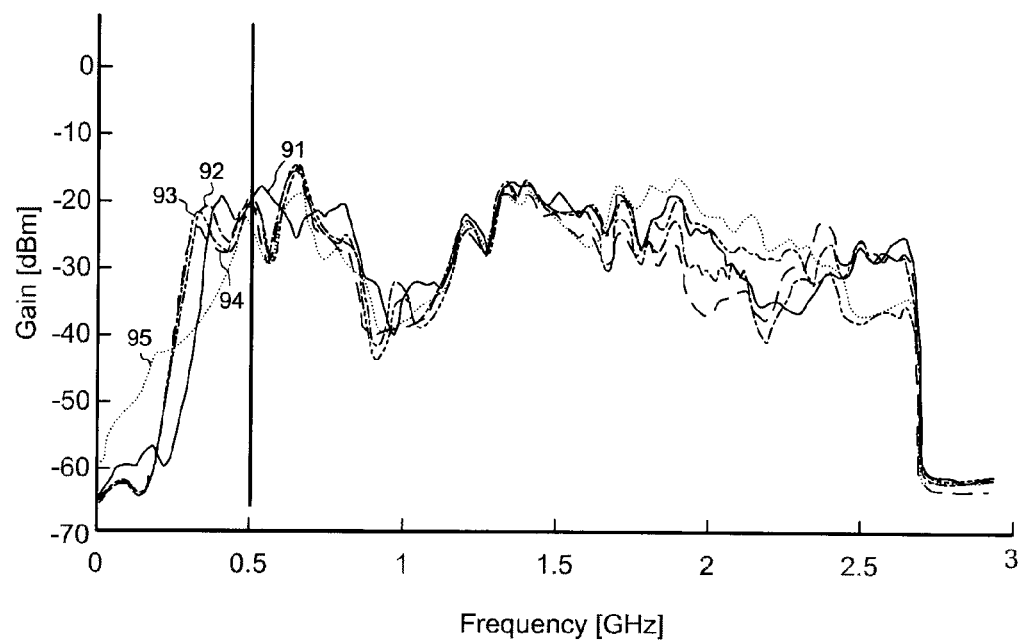
FIG. 6 is a graph showing examples of characteristics of the discharge detector of the first embodiment.

In FIG. 6, a solid line 91 is a characteristic example when the front surface of the slot antenna 61 was in direct contact with the insulating spacer 30 as shown in FIG. 5A. A dashed line 92 is a characteristic example of the detector 60 shown in FIG. 3 when the silicon rubber sheet was used as the elastic member 65, a two-dot chain line 93 is a characteristic example of the detector 60 shown in FIG. 3 when the synthetic rubber sheet was used as the elastic member 65, and a broken line 94 is a characteristic example of the detector 60 shown in FIG. 3 when the Sorbothane sheet was used as the elastic member 65. A dotted line 95 is a characteristic example when there was a gap between the slot antenna 61 and the insulating spacer 30 as shown in FIG. 5B.

As shown in FIG. 6, when the slot antenna 61 and the insulating spacer 30 are in contact with each other (solid line 91), an output of about –19 [dBm] is obtained near 0.5 GHz at which the highest detection sensitivity is obtained in a generally used slot antenna (its long side has a size of about 150 [mm] as previously described), but when there is a gap between the slot antenna 61 and the insulating spacer 30 (dotted line 95 in FIG. 6), the detection output is lowered to about –25 [dBm]. On the other hand, when the elastic member 65 is inserted between the slot antenna 61 and the insulating spacer 30 (the dashed line 92, the two-dot chain line 93, and the broken line 94 in FIG. 6), the deterioration of a reception output is relatively reduced and a detection output of about −20 [dBm] can be obtained. Further, substantially the same characteristic was obtained irrespective of the kind of the elastic member 65.

These results show that providing the elastic member 65 as in the detector 60 according to the embodiment makes it possible to obtain good reception sensitivity when, in the gas-insulated apparatus 1 shown in FIG. 1, the peripheral edge surface of the insulating spacer 30 is located on a deeper side of the position of the peripheral edges of the flange portions 12 and 22.

Second Embodiment

Next, a detector according to a second embodiment will be described in detail. From the measurement results shown in FIG. 6, it is seen that the best result is obtained when the insulating spacer 30 of the gas-insulated apparatus 1 and the front surface of the slot antenna 61 of the detector 60 are in direct contact with each other. The detector 160 of this embodiment is characterized in that the slot antenna is in direct contact with the insulating spacer without the elastic member being interposed therebetween when a distance between the flanges in the coupling portion of the conductive pipes is relatively large.

Figure 7:
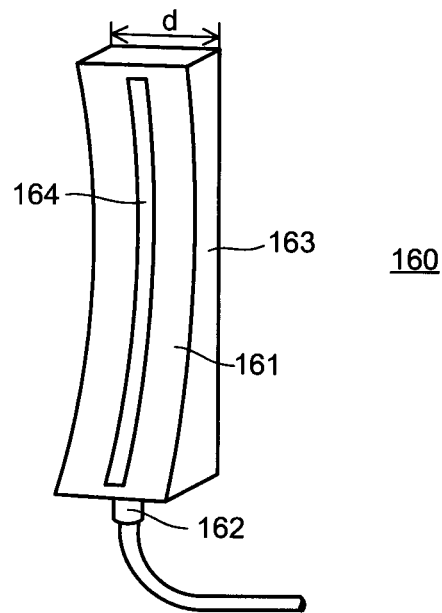
FIG. 7 is a view showing an external appearance of a discharge detector of a second embodiment.
Figure 8:
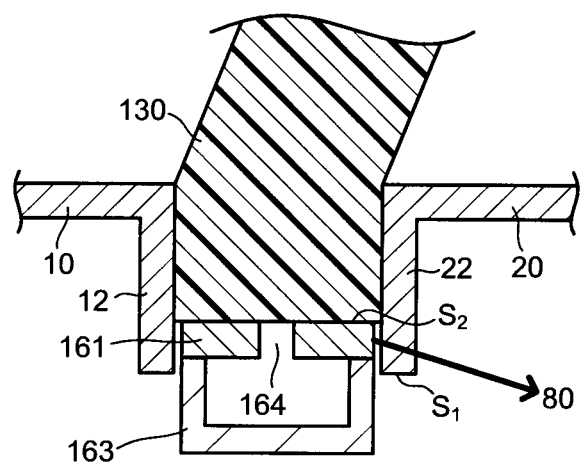
FIG. 8 is a view showing an external appearance of the discharge detector of the second embodiment.

As shown in FIG. 7 and FIG. 8, the detector 160 of this embodiment includes: a planar slot antenna 161 in which a slot 164 is formed; a connector 162 outputting an electromagnetic wave detected by the slot antenna 161; and a casing 163 formed so as to surround a rear surface of the slot antenna 161. That is, the detector 160 of this embodiment is structured such that the elastic member 65 is removed from the detector 60 of the first embodiment shown in FIG. 1 to FIG. 3, and a width of the slot antenna 61 in terms of a longitudinal direction of the conductive pipes is smaller than the distance e in FIG. 1 of a gap between the flanges where the detector is disposed (smaller than the thickness of the annular portion 30a of the insulating spacer 30). By this structure, the slot antenna and the insulating spacer can be constantly in direct contact with each other even without the elastic member, which makes it possible to prevent the attenuation of the electromagnetic wave leaking via the insulating spacer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the forms of the embodiments described herein may be made without departing from the spirit of the inventions. The accompanying claims and their equivalents are intended to cover such forms or modifications as would fall within the scope and spirit of the inventions.

What is claimed is:

1. A partial discharge detector for gas-insulated electric apparatus detecting an electromagnetic wave ascribable to partial discharge in a gas-insulated electric apparatus, the gas-insulated electric apparatus comprising:
   a conductor to be applied with high voltage;
   a plurality of disk-shaped insulating plates, each of the disk-shaped insulating plates having a conductive supporting hole at a center thereof to support the conductor; and
   a plurality of flanged conductive pipes, each of the flanged conductive pipes having a flange portion pressingly sandwiching and holding a peripheral edge portion of the insulating plate from both surface sides to form a sealed container of the gas-insulated electric apparatus filled with insulating gas, and the partial discharge detector comprising:
   an elastic member disposed between the flange portions on the insulating plate exposed from the flange portions of the flanged conductive pipes, the elastic member being capable of transmitting the electromagnetic wave;
   a slot antenna made of a plate-shaped conductor disposed in close contact with the elastic member between the flange portions to detect the electromagnetic wave, the plate-shaped conductor having a slot at the center thereof, the slot extending along a circumference of the flange portion, the slot having narrower width than a width of the exposed portion of the insulating plate, the elastic member covering the slot on a front surface of the plate-shaped conductor, the elastic member filling a space surrounded by the insulating plate, the flange portions and the plate-shaped conductor; and
   a casing configured to cover the slot on a rear surface of the plate-shaped conductor to form a resonant cavity.

2. The partial discharge detector for gas-insulated electric apparatus according to claim 1,
   wherein the elastic member is made of an insulating material having a dielectric constant whose value is similar to a dielectric constant of the insulating plate.

3. The partial discharge detector for gas-insulated electric apparatus according to claim 1,
   wherein the slot has a length L expressed by the following mathematical expression, $$L = \frac{\lambda}{2\sqrt{\varepsilon}}$$

where $\lambda$ is a detection center wavelength of the electromagnetic wave and $\in$ is a relative dielectric constant of the elastic member.

4. The partial discharge detector for gas-insulated electric apparatus according to claim 1,
   wherein the casing has such a width that a width t in a short-side direction of the slot is expressed as $\lambda/2$, where $\lambda$ is a detection center wavelength of the electromagnetic wave.

5. The partial discharge detector fir gas-insulated electric apparatus according to claim 1, further comprising:
   a measuring unit to measure intensity or a frequency characteristic of the electromagnetic wave detected by the slot antenna; and
   a determining unit to determine whether the partial discharge is present or absent based on the intensity or the frequency characteristic of the electromagnetic wave measured by the measuring unit.

6. The partial discharge detector tier gas-insulated electric apparatus according to claim 1, wherein the elastic member is positioned inside a gap formed between the insulating plate and the slot antenna.

7. The partial discharge detector for gas-insulated electric apparatus according to claim 6, wherein the elastic member fills the gap.

8. The partial discharge detector for gas-insulated electric apparatus according to claim 1, wherein the elastic member is positioned inside a gap formed between the flange portions.

9. The partial discharge detector for gas-insulated electric apparatus according to claim 8, wherein the elastic member fills the gap.

10. The partial discharge detector for gas-insulated electric apparatus according to claim 1, wherein a gap is formed between end surfaces of the flange portions and between a peripheral edge surface of the insulating plate and a front surface of the slot antenna, and wherein the elastic member is positioned inside the gap.

11. The partial discharge detector for gas-insulated electric apparatus according to claim 10, wherein the elastic member fills the gap.

12. The partial discharge detector for gas-insulated electric apparatus according to claim 1, wherein the elastic member has a width that is smaller than a width of an outer peripheral surface of the insulating plate.

13. The partial discharge detector for gas-insulated electric apparatus according to claim 1, wherein the elastic member is in contact with the insulating plate.

* * * * *

UNITED STATES PATENT AND TRADEMARK OFFICE
CERTIFICATE OF CORRECTION

PATENT NO. : 8,981,761 B2
APPLICATION NO. : 12/896020
DATED : March 17, 2015
INVENTOR(S) : Maruyama et al.

It is certified that error appears in the above-identified patent and that said Letters Patent is hereby corrected as shown below:

In the claims

Claim 5, column 8, line 49, change "The partial discharge detector fir gas-insulated electric" to --The partial discharge detector for gas-insulated electric--.

Claim 6, column 8, line 58, change "The partial discharge detector tier gas-insulated electric" to --The partial discharge detector for gas-insulated electric--.

Signed and Sealed this
Eighteenth Day of August, 2015

Michelle K. Lee
*Director of the United States Patent and Trademark Office*